United States Patent
Kabir

(10) Patent No.: US 8,339,302 B2
(45) Date of Patent: Dec. 25, 2012

(54) ANALOG-TO-DIGITAL CONVERTER HAVING A COMPARATOR FOR A MULTI-STAGE SAMPLING CIRCUIT AND METHOD THEREFOR

(75) Inventor: Mohammad Nizam U. Kabir, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 71 days.

(21) Appl. No.: 12/846,589

(22) Filed: Jul. 29, 2010

(65) Prior Publication Data

US 2012/0026026 A1 Feb. 2, 2012

(51) Int. Cl.
*H03M 1/38* (2006.01)
(52) U.S. Cl. .................. 341/161; 341/155; 341/122
(58) Field of Classification Search .......... 341/122, 341/155, 172, 156, 111, 169, 170
See application file for complete search history.

(56) References Cited

U.S. PATENT DOCUMENTS

| | | | |
|---|---|---|---|
| 5,644,313 A | 7/1997 | Rakers et al. | |
| 6,081,215 A * | 6/2000 | Kost et al. | 341/120 |
| 6,166,595 A * | 12/2000 | Moldsvar et al. | 330/9 |
| 6,452,518 B1 * | 9/2002 | Kawabata | 341/118 |
| 6,535,157 B1 | 3/2003 | Garrity et al. | |
| 6,909,393 B2 | 6/2005 | Atriss et al. | |
| 7,388,931 B1 * | 6/2008 | Hsu et al. | 375/316 |
| 7,443,333 B2 | 10/2008 | Garrity et al. | |
| 7,551,114 B2 * | 6/2009 | Joy et al. | 341/161 |
| 7,589,658 B2 | 9/2009 | Ren et al. | |
| 2004/0155807 A1 * | 8/2004 | van der Goes et al. | 341/156 |
| 2005/0073351 A1 * | 4/2005 | Ko et al. | 327/337 |
| 2007/0285296 A1 * | 12/2007 | Bilhan | 341/155 |

FOREIGN PATENT DOCUMENTS

WO 2004021251 A2 3/2004

OTHER PUBLICATIONS

Nagaraj, K., et al., "A 250-mW, 8-b, 52-Msamples/s Parallel-Pipelined A/D Converter with Reduced Number of Amplifiers", IEEE Journal of Solid-State Circuits, vol. 32, No. 3, Mar. 1997, pp. 312-320.
EP Application No. 11170583.6.2206, International Search Report and Written Opinion, mailed Feb. 13, 2012.

* cited by examiner

*Primary Examiner* — Peguy Jean Pierre
(74) *Attorney, Agent, or Firm* — Daniel D. Hill; James L. Clingan, Jr.

(57) ABSTRACT

An analog to digital converter includes a first sample circuit that samples an analog input during a first phase of a clock. A second sample circuit samples the analog input during a second phase of the clock. A comparator compares a reference to the output of the first sample circuit during a non-overlapping time between an end of the first phase and beginning of the second phase and compares the reference to the output of the second sample circuit during a non-overlapping time between an end of the second phase and beginning of the first phase. The first sample circuit couples the sample of the analog input taken by the first sample circuit to the input of the comparator during the non-overlapping time between the end of the first phase and the beginning of the second phase and the second sample circuit couples the sample of the analog input taken by the second sample circuit to the input of the comparator during the non-overlapping time between the end of the second phase and the beginning of the first phase.

20 Claims, 4 Drawing Sheets

ANALOG-TO-DIGITAL CONVERTER HAVING A COMPARATOR FOR A MULTI-STAGE SAMPLING CIRCUIT AND METHOD THEREFOR

BACKGROUND

1. Field

This disclosure relates generally to analog-to-digital converters, and more specifically, to an analog-to-digital converter (ADC) having a comparator for a multi-stage sampling circuit and method therefor.

2. Related Art

A redundant signed digit (RSD) algorithm is used in a cyclic, or pipelined, ADC. The RSD ADC typically converts an analog signal to a corresponding digital value through a series of sample and comparison phases using sampling circuits and corresponding sets of comparators. The sampling circuit may include a number of capacitors and switches to sample an analog input signal to be converted to a digital form. A resolution of the RSD ADC may depend on the number of capacitors in each sampling circuit and the number of comparators in a set of comparators. Typically, in a RSD stage, a single set of comparators is used with each sampling network. However, in a double-sampled RSD stage, for example, using two sets of comparators requires a large amount of surface area on an integrated circuit. To reduce the surface area required for the ADC, only one set of comparators may be used and shared between two sampling circuits. The use of the single set of comparators may require that a sampling clock be provided at two times a clock rate used for an ADC having two sets of comparators. Also, when a comparator is activated, or tripped, to perform the comparison, the comparator operation may affect the stored charge on the sampling capacitors, thus reducing the accuracy of a conversion.

Therefore, what is needed is an RSD ADC that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
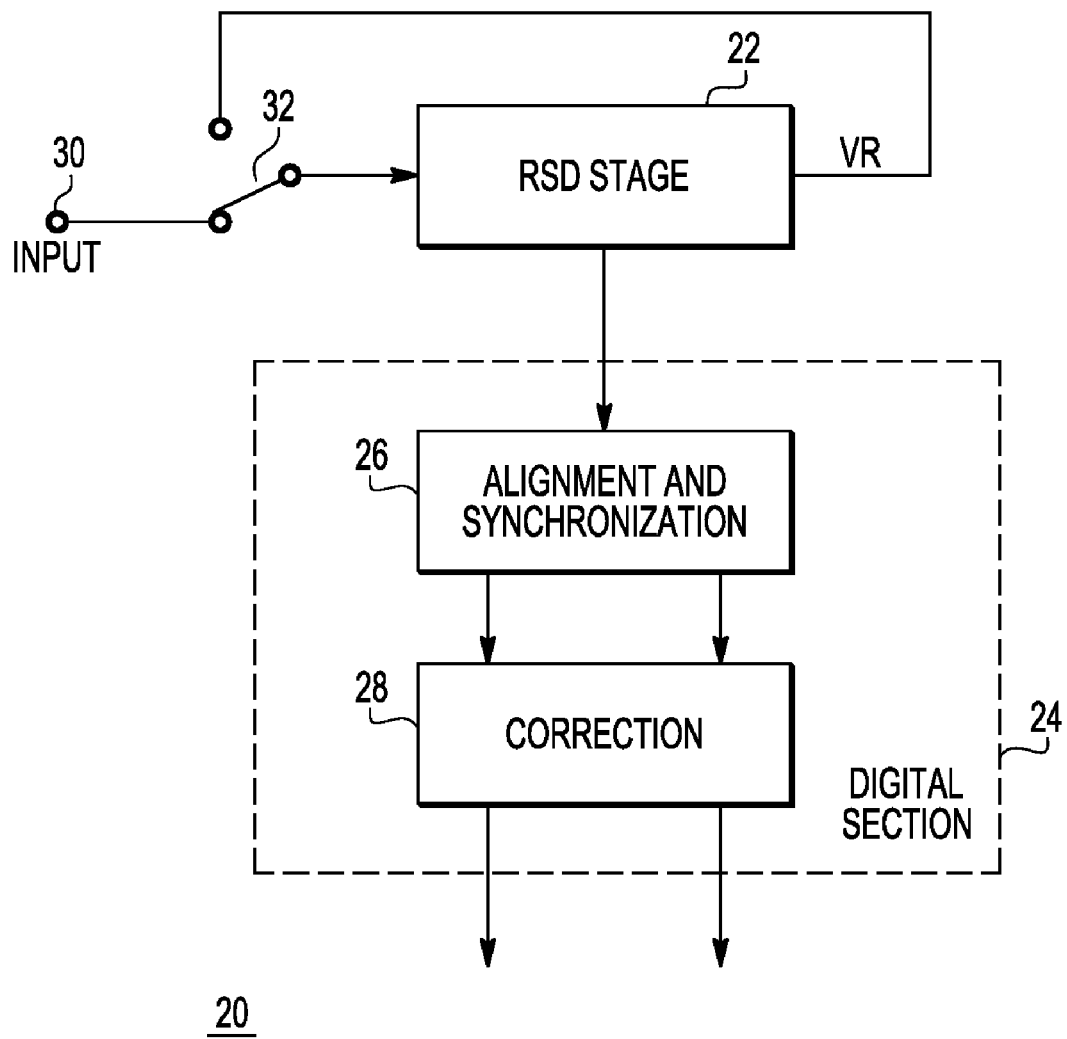
FIG. 1 illustrates, in block diagram form, a cyclic RSD ADC in accordance with an embodiment.

Generally, there is provided, an RSD ADC having two sampling circuits and a single set of comparators. The single set of comparators is shared between the two sampling circuits, where each of the sampling circuits includes a plurality of switches and capacitors. Two non-overlapping sampling clock signals are used to define two sampling phases, one for each of the sampling circuits. A comparison phase occupies the non-overlapping time period between the two sampling phases. Logic circuitry is provided with the single set of comparators to trip, or activate, the comparators during the comparison phase. By performing the comparison between the sampling phases, during the non-overlapping time period of the sampling clocks, the stored charge on the capacitors is not disturbed, thus improving accuracy of the A/D conversion.

In one aspect, there is provided, an analog to digital converter, comprising: a first sample circuit having an input coupled to an analog input that takes a sample of the analog input during a first phase of a clock; a second sample circuit having an input coupled to the analog input that samples the analog input during a second phase of the clock; and a comparator having an input coupled to the output of the first sample circuit and the output of the second sample circuit wherein the comparator compares a reference to the output of the first sample circuit during a non-overlapping time between an end of the first phase and beginning of the second phase and compares the reference to the output of the second sample circuit during a non-overlapping time between an end of the second phase and beginning of the first phase; wherein the first sample circuit couples the sample of the analog input taken by the first sample circuit to the input of the comparator during the non-overlapping time between the end of the first phase and the beginning of the second phase and the second sample circuit couples the sample of the analog input taken by the second sample circuit to the input of the comparator during the non-overlapping time between the end of the second phase and the beginning of the first phase. The analog input may comprise a positive input signal and a minus input signal. The reference may comprise a positive reference voltage and negative reference voltage. The comparator may finish comparing the reference to the output of the first sample circuit during the non-overlapping time between the end of the first phase and the beginning of the second phase. The comparator may finish comparing the reference to the output of the second sample circuit during the non-overlapping time between the end of the second phase and the beginning of the first phase. The comparator may provide an output comprising a pair of differential signals. The analog to digital converter may further comprise an output circuit coupled to the output of the comparator that provides a data output signal. The output circuit may comprise: a latch having an input coupled to the output of the comparator and an output; and a flip-flop having an input coupled to the output of the latch and an output for providing the data output signal. The analog to digital converter may further comprise a reset circuit having an input coupled to the output of the comparator and an output coupled to the comparator. The reset circuit may reset the comparator after the latch has latched the output of the comparator.

In another aspect, there is provided, a method of operating a circuit to perform an analog to digital conversion, comprising: sampling an analog signal during a first phase of a clock; after ending the first phase of the clock, providing, from a comparator, a digital output representative of the analog signal sampled during the first phase of the clock; sampling the analog signal during a second phase of the clock, wherein the second phase of the clock begins after providing the digital output representative of the analog signal sampled during the first phase of the clock; and after ending the second phase of the clock, providing, from the comparator, a digital output representative of the analog signal sampled during the second phase of the clock. The method may further comprise resetting the comparator after providing the digital output representative of the analog signal sampled during the first phase of the clock. The method may further comprise resetting the comparator after providing the digital output representative of the analog signal sampled during the second phase of the clock. The method may further comprise: generating pulses representative of times between the first and second phases; and providing the pulses to the comparator. Rising edges of the pulses may time latching of the comparator and falling edges may time the resetting of the comparator. The step of providing the digital output representative of the analog signal sampled during the first phase of the clock may further comprise comparing the analog signal to a positive reference and a minus reference. The method may further comprise latching the output of the comparator.

In yet another aspect, there is provided, a method of operating a circuit to perform an analog to digital conversion, comprising: providing a first analog signal to a comparator sampled during a first phase of a clock; providing a digital output from the comparator representative of the first analog signal prior to a second phase of the clock; resetting the comparator after providing the digital output from the comparator representative of the first analog signal; providing a second analog signal to the comparator sampled during the second phase of the clock; providing a digital output from the comparator representative of the second analog signal after the resetting the comparator. The digital output from the comparator may be representative of the second analog signal and is provided at a time between second and first phases of the clock. The method may further comprise resetting the comparator after providing the digital output from the comparator representative of the second analog signal.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 illustrates, in block diagram form, a cyclic RSD ADC 20 in accordance with an embodiment. The ADC 20 includes a single RSD stage 22 and a digital section 24. An analog input signal is provided to the RSD stage 22 from an input terminal 30 by way of a first switch 32. The RSD stage 22 provides a digital output signal to the digital section 24. The RSD stage 22 also generates a residual voltage signal VR, which is fed back by way of the first switch 32. The first switch 32 is closed for the first cycle, in which the analog input signal is received, and then opened for the remaining number of cycles that it takes to complete converting the analog signal to a digital signal. Preferably, the feedback loop of the RSD stage 22 is directly connected from the RSD stage 22 output to the first switch 32. As is understood by those of skill in the art, the number of required cycles depends on the number of bits in the digital output signal. For example, as described in more detail below, for a ten bit output signal, ten comparator clock cycles are needed in the illustrated embodiment. In other embodiments, the number of bits of the output signal may be different.

The digital section 24 has an alignment and synchronization block 26 and a correction block 28. The digital bits output from the RSD stage 22 are provided to the digital section 24, where they are aligned, synchronized, and combined to provide a standard format binary output code. As is understood by those of ordinary skill in the art, there are a number of ways to perform the alignment and synchronization, such as taught in U.S. Pat. No. 5,644,313, herein incorporated by reference, and the present invention is not intended to be limited to any particular way.

Figure 2:
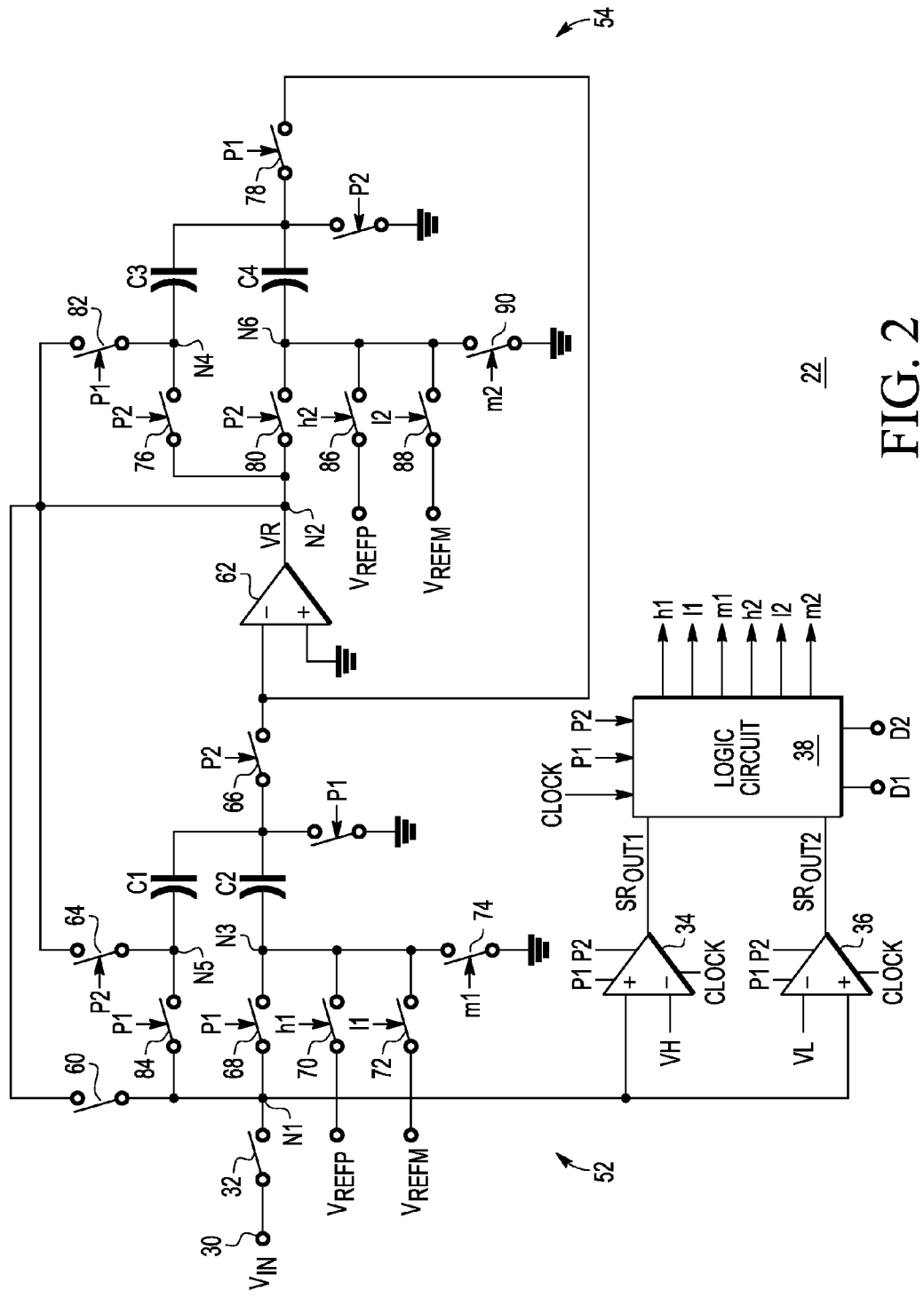
FIG. 2 illustrates an RSD stage of the cycle ADC of FIG. 1 in more detail.

FIG. 2 illustrates a detailed embodiment of RSD stage 22 of cycle ADC 20 of FIG. 1. The RSD stage 22 includes the input terminal 30 that receives an analog input signal. The first switch 32 is connected between the input terminal 30 and a first node N1 for selectively applying the analog input signal VIN to the first node N1. The feedback switch 60 is connected between the first node N1 and a second node N2 for selectively applying the residual voltage feedback signal VR to the first node N1. As previously discussed, when the first switch 32 is closed, the feedback switch 60 is open and when the first switch 32 is open, the feedback switch 60 is closed. The first switch 32 is closed in a first cycle of an analog-to-digital (A/D) conversion operation and the feedback switch 60 is closed in subsequent cycles of the A/D operation. When the feedback switch 60 is closed, a residual voltage feedback signal VR is applied to the first node N1.

RSD stage 22 includes two sample circuits 52 and 54 that are alternately connected to the inputs of comparators 34 and 36. Sample circuit 52 includes switches 64, 66, 68, 70, 72, and 84, and capacitors C1 and C2. Sample circuit 54 includes switches 78 82, 76, 80, 86, and 88, and capacitors C3 and C4. In other embodiments, the sample circuits may be different, including the number of capacitors and the number and connections of the switches and the capacitors.

Depending on the switch positions, the comparators 34 and 36 have an input connected to the output of the first sample circuit 52 and the output of the second sample circuit 54. The comparators 34 and 36 compare reference voltages VH and VL to the output of the first sample circuit 52 during a non-overlapping time between an end of the first phase P1 and beginning of the second phase P2, and compares the reference voltages to the output of the second sample circuit 54 during a non-overlapping time between an end of the second phase P2 and beginning of the first phase P1. A reset circuit resets the comparator after the output of the comparator is latched. A digital representation of the analog input signal VIN is provided at the end of the comparison.

The first comparator 34 has a positive input terminal connected to the first node N1 and a negative input terminal that receives the predetermined high voltage VH. The first comparator 34 compares a selected one of the analog input signal VIN and the residual voltage feedback signal VR to the predetermined high voltage VH, as determined by the position of the first switch 32, feedback switch 60, and clock signals Pl, P2, and CLOCK, and generates a first comparator output signal labeled SROUT1. The second comparator 36 has its positive input terminal connected to the first node N1 and its negative input terminal receives the predetermined low voltage VL. The second comparator 36 compares the selected one of the analog input signal and the residual voltage feedback signal to the predetermined low voltage VL and generates a second comparator output signal SROUT2. In the illustrated embodiment, the second comparator 36 is substantially identical to the first comparator 34. RSD stage 22 only has two comparators. In other embodiments, RSD stage 22 may have more than two comparators depending on the desired conversion resolution. Also, the illustrated embodiment of FIG. 2 is single-ended for the purposes of simplicity and clarity. In another embodiment, RSD stage 22 may be partially or fully differential.

An operational amplifier 62 has a negative input terminal coupled to the first node N1 for receiving the selected one of the analog input signal VIN and the residual voltage feedback signal VR. A positive input terminal of the operational amplifier 62 is connected to ground. An output terminal of the operational amplifier 62 is connected to the second node N2. The operational amplifier 62 generates the residual voltage feedback signal VR and applies it to the second node N2. The residual voltage feedback signal VR is preferably provided directly from the output of the operational amplifier 62 at the second node N2 to the input of the operational amplifier 62 without an intervening sample and hold circuit.

The logic circuit 38 is connected to the first and second comparators 34 and 36 and receives the first and second comparator output signals SROUT1 and SROUT2, clock signal CLOCK, and clock phase signals P1 and P2. The logic circuit 38 generates digital output signals D1 and D2 based on the first and second comparator output signals SROUT1 and SROUT2, respectively. The logic circuit 38 also generates a plurality of control signals h1, h2, 11, 12, m1 and m2, which are used to control the switches of the RSD stage 22. As will be understood by those of skill in the art, the control signals h1, h2, 11, 12, m1 and m2 correspond to the high, mid and low switch control signals.

First capacitor C1 is connected to the second node N2 by way of a third switch 64 and to the negative input terminal of the operational amplifier 62 by way of a fourth switch 66. The third and fourth switches 64, 66 are controlled with a clock signal P2. Second capacitor C2 is connected to the negative input terminal of the operational amplifier 62 by way of the fourth switch 66 and to the first node by way of a fifth switch 68. The fifth switch 68 is controlled by a clock signal P1.

A sixth switch 70 is connected between a first reference voltage source (VREFP) and a third node N3 located between the second capacitor C2 and the fifth switch 68. The sixth switch is controlled by the signal h1 generated by the logic circuit 38. A seventh switch 72 is connected between a second reference voltage source (VREFM) and the third node N3. The seventh switch 72 is controlled by the signal 11 generated by the logic circuit 38. An eighth switch 74 is connected between a zero voltage or ground and the third node N3. The eighth switch 74 is controlled by the signal m1 generated by the logic circuit 38.

A third capacitor C3 is connected to the second node N2 by way of a ninth switch 76 and to the negative input terminal of the operational amplifier 62 by way of a tenth switch 78. The ninth switch 76 is controlled by clock signal P2 and the tenth switch 78 is controlled by the clock signal P1. A fourth capacitor C4 is connected to the second node N2 by way of an eleventh switch 80 and to the negative input terminal of the operational amplifier 62 by way of the tenth switch 78. The eleventh switch 80 is controlled by the clock signal P2. A twelfth switch 82 is connected between the second node N2 and a fourth node N4 located between the third capacitor C3 and the ninth switch 76. The twelfth switch 82 is controlled by the clock signal P1. A thirteenth switch 84 is connected between the feedback switch 60 and a fifth node N5, which is located between the first capacitor C1 and the third switch 64. The thirteenth switch 84 is controlled by the clock signal P1. Clock signal P1 defines a first phase and clock signal P2 defines a second phase. A clock cycle of clock signal CLOCK includes two phases.

A fourteenth switch 86 is connected between the first reference voltage source (VREFP) and a sixth node N6 located between the eleventh switch 80 and the fourth capacitor C4. The fourteenth switch 86 is controlled by control signal h2 generated by the logic circuit 38. A fifteenth switch 88 is connected between the second reference voltage source (VREFM) and the sixth node N6. The fifteenth switch 88 is controlled by the control signal 12 generated by the logic circuit 38. A sixteenth switch 90 is connected between the sixth node N6 and ground. The sixteenth switch 90 is controlled by the control signal m2 generated by the logic circuit 38.

The input signal or residual voltage feedback is sampled onto the capacitors C1 and C2 during the phase P1. Then during the phase P2, the sampled input signal that was previously stored on the capacitors C1 and C2 during phase P1 is processed to form an output or residue signal equal to two times the input signal plus or minus the reference voltage (VREFP, VREFM) or the zero voltage.

Figure 3:
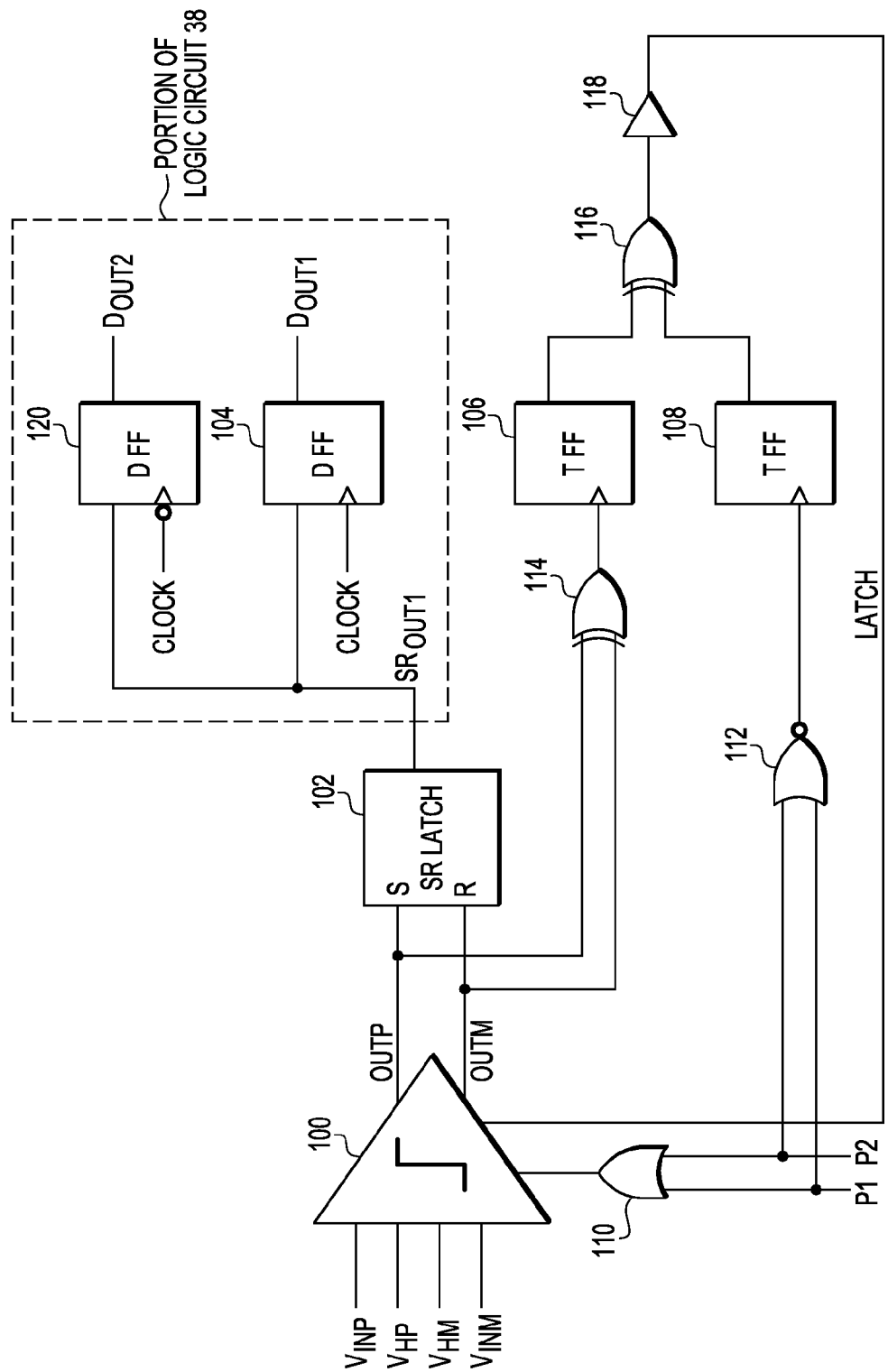
FIG. 3 illustrates a comparator of the RSD stage and a portion of the logic circuit of FIG. 2 in more detail.

FIG. 3 illustrates comparator 34 of RSD stage 22 and a portion of logic circuit 38 of FIG. 2 in more detail. Comparator 34 includes comparator circuit 100, SR latch 102, toggle flip-flops 106 and 108, OR logic gate 110, NOR logic gate 112, exclusive OR logic gates 114 and 116, and buffer 118. Buffer 118 can be constructed by cascading two inverters. The illustrated portion of logic circuit 38 includes D-type flip-flops 104 and 120. Comparator circuit 100 is a differential comparison circuit for comparing the voltage level of analog input signal VIN to reference voltage VH. Comparator circuit 100 has first differential inputs for receiving differential signal VINP and VINM corresponding to analog input signal VIN, where "P" stands for positive and "M" stands for minus. Comparator circuit 100 also has second differential inputs for receiving differential signal VHP and VHM, where differential signals VHPNHM correspond to the single-ended signal VH in FIG. 2. In another embodiment, comparator 100 may be a single-ended comparator circuits. Comparator circuit 100 has a control input connected to an output of OR logic gate 110, and a control input for receiving a feedback signal labeled "LATCH". OR logic gate 110 and NOR logic gate both have a first input for receiving clock signal P1 and a second input for receiving clock signal P2. SR latch 102 has inputs for receiving differential output signals OUTP and OUTM from comparator circuit 100. An output of SR latch 102 is connected to an input of each of D-type flip-flops 104 and 120. D-type flip-flops 104 and 120 each have an output for providing output signals DOUT1 and DOUT2, respectively, in response to receiving clock signal CLOCK. Output signals DOUT1 and DOUT2 are internal to logic circuit 38. Output signals D1 and D2 from logic circuit 38 are derived from output signals DOUT1 and DOUT2. Exclusive OR logic gate 114 has a first input connected a first output of comparator circuit 100 for receiving output signal OUTP, and a second input connected to a second output of comparator circuit 100 for receiving output signal OUTM. Toggle flip-flop 106 has a clock input connected to the output of exclusive OR logic gate 114, and toggle flip-flop 108 has an input connected to the output of NOR logic gate 112. Exclusive OR logic gate 116 has input connected to the outputs of toggle flip-flops 106 and 108, and an output connected to an input of buffer 118. Buffer 118 provides a feedback signal labeled "LATCH" to the control input of comparator circuit 100.

Figure 4:
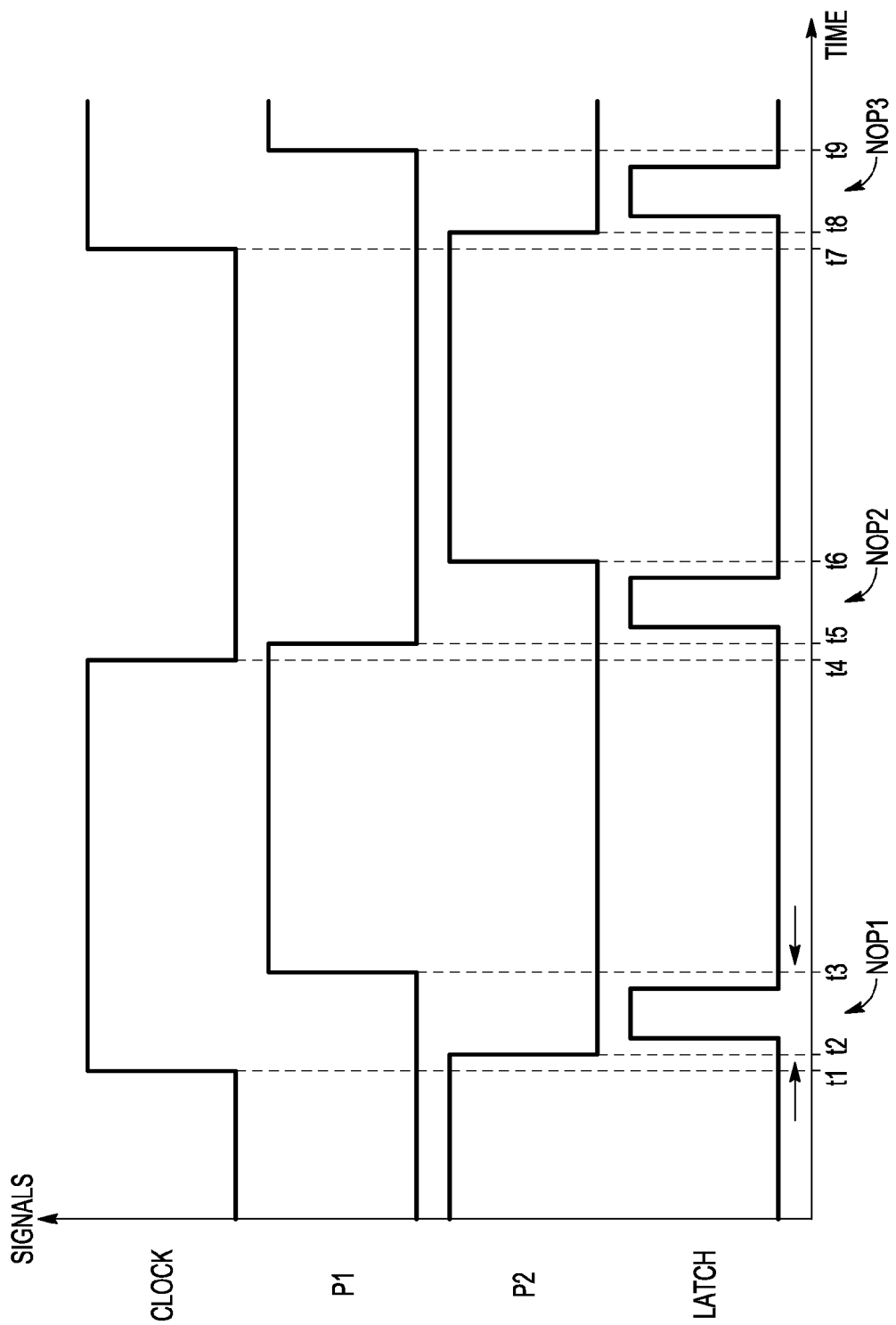
FIG. 4 illustrates a timing diagram of various signals of the cycle ADC of FIG. 1.

FIG. 4 illustrates a timing diagram of various signals of cyclic ADC 20 of FIG. 1. Clock phase signals P1 and P2 are based on clock signal CLOCK, and are used to control the switch timing of RSD stage 22. When P1 is a logic high, switches that receive P1 are closed. When P1 is a logic low, switches that receive P1 are open. Likewise, when P2 is a logic high, switches that receive P2 are closed. When P2 is a logic low, switches that receive P2 are open. In another embodiment, logic operation of clock phase signals P1 and P2 may be opposite. As can be seen in FIG. 4, clock phase signal P1 and P2 are non-overlapping clock signals. Feedback signal LATCH (FIG. 3) is pulsed high in the non-overlapping portions of clock phase signals P1 and P2. A first pulse of feedback signal LATCH between times t2 and t3 is labeled "NOP1", a second pulse of feedback signal LATCH between times t5 and t6 is labeled "NOP2", and a third pulse between times t8 and t9 is labeled "NOP3". Rising edges of the LATCH pulses time latching of the comparators 34 and 36 and falling edges time the resetting of the comparator. Clock signal CLOCK transitions high at time t1. Signal P2 transitions low at time t2 after time t1. A time period after P2 transitions, P1 transitions high at time t3. The time between time t2 and t3 is the non-overlapping time period between the falling edge of P2 and the rising edge of P1. At time t4 is a falling edge of clock signal CLOCK. The time between time t5 and t6 is the non-overlapping time period between a falling edge of P1 and a rising edge of P2. Time t7 is the end of one clock cycle of clock signal CLOCK and the rising edge of the next clock cycle of clock signal CLOCK. As can be seen, there are two phases for RSD stage 20 in one clock cycle of clock signal CLOCK.

The rising edge of the latch signal LATCH controls the comparison of comparators 34 and 36 to occur during the non-overlapping time period between the logic high periods of clock phase signals P1 and P2. In comparator 100 of FIG. 3, when the voltage level of VIN is higher than a voltage level of VREF, the S input of SR latch 102 is a logic one and the R input is a logic zero. When the voltage level of VIN is lower than the voltage level of VREF, the S input is a logic zero and the R input is a logic high. When comparator 100 is in reset mode, both of outputs OUTP and OUTM are logic high signals. The output of SR latch is provided to D-type flip-flops 104 and 120 and the output signal DOUT1 is provided at the rising edge of clock signal CLOCK and the output signal DOUT2 is provided at the falling edge of clock signal CLOCK. Clock phase signals P1 and P2 are both low during the non-overlapping time periods. At this time, NOR logic gate provides a logic high signal to toggle flip-flop 108 and then exclusive OR logic gate 116 provides a logic one to the input of buffer 118 resulting in the LATCH signal being provided to the control input of comparator 100 as a logic high. Comparator circuit 100 provides a logic one from one of its outputs when a comparison is being performed, so toggle flip-flop 106 provides a logic one. When exclusive OR 116 receives the logic one from flip-flop 106 and the logic one from flip-flop 108, exclusive OR logic gate 116 provides a logic zero for the time period that clock phase signals P1 and P2 are both low. Buffer 118 then provides the logic zero pulse to the control input of comparator circuit 110.

By doing the comparison portion of the A/D conversion during the non-overlapping time periods of signals P1 and P2, a single set of comparators can be used with two sampling circuits. Using one set of comparators reduces the surface area needed on an integrated circuit to implement ADC 20. Also, by doing the comparison during the non-overlapping time period, the "tripping" of the comparator during a comparison does not disturb the sample voltages on capacitors C1, C2, C3, and C4.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Thus, it is to be understood that the circuits depicted herein are merely exemplary, and that in fact many other circuits can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of circuits or intermedial components. Likewise, any two components so associated can also be viewed as being "operably connected," or "operably coupled," to each other to achieve the desired functionality.

Those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An analog to digital converter, comprising:
a first sample circuit having an input coupled to an analog input that takes a sample of the analog input during a first phase of a clock;
a second sample circuit having an input coupled to the analog input that samples the analog input during a second phase of the clock; and
a comparator having an input coupled to the output of the first sample circuit and the output of the second sample circuit wherein the comparator compares a reference to the output of the first sample circuit during a non-overlapping time between an end of the first phase and beginning of the second phase and compares the reference to the output of the second sample circuit during a non-overlapping time between an end of the second phase and beginning of the first phase;
wherein the first sample circuit couples the sample of the analog input taken by the first sample circuit to the input of the comparator during the non-overlapping time between the end of the first phase and the beginning of the second phase and the second sample circuit couples the sample of the analog input taken by the second sample circuit to the input of the comparator during the non-overlapping time between the end of the second phase and the beginning of the first phase.

2. The analog to digital converter of claim 1, wherein the analog input comprises a positive input signal and a minus input signal.

3. The analog to digital converter of claim 2, wherein the reference comprises a positive reference voltage and negative reference voltage.

4. The analog to digital converter of claim 1, wherein the comparator finishes comparing the reference to the output of the first sample circuit during the non-overlapping time between the end of the first phase and the beginning of the second phase.

5. The analog to digital converter of claim 4, wherein the comparator finishes comparing the reference to the output of the second sample circuit during the non-overlapping time between the end of the second phase and the beginning of the first phase.

6. The analog to digital converter of claim 5, wherein the comparator provides an output comprising a pair of differential signals.

7. The analog to digital converter of claim 6, further comprising an output circuit coupled to the output of the comparator that provides a data output signal.

8. The analog to digital converter of claim 7, wherein the output circuit comprises:
a latch having an input coupled to the output of the comparator and an output; and
a flip-flop having an input coupled to the output of the latch and an output for providing the data output signal.

9. The analog to digital converter of claim 8, further comprising a reset circuit having an input coupled to the output of the comparator and an output coupled to the comparator.

10. The analog to digital converter of claim 9, wherein the reset circuit resets the comparator after the latch has latched the output of the comparator.

11. A method of operating a circuit to perform an analog to digital conversion, comprising:
sampling an analog signal during a first phase of a clock;
after ending the first phase of the clock and before beginning a next instance of a second phase of the clock, providing, from a comparator, a digital output representative of the analog signal sampled during the first phase of the clock;
sampling the analog signal during the next instance of the second phase of the clock, wherein the second phase of the clock begins after providing the digital output representative of the analog signal sampled during the first phase of the clock; and
after ending the second phase of the clock, providing, from the comparator, a digital output representative of the analog signal sampled during the second phase of the clock.

12. The method of claim 11 further comprising latching the output of the comparator.

13. A method of operating a circuit to perform an analog to digital conversion, comprising:
sampling an analog signal during a first phase of a clock;
after ending the first phase of the clock, providing, from a comparator, a digital output representative of the analog signal sampled during the first phase of the clock;
resetting the comparator after providing the digital output representative of the analog signal sampled during the first phase of the clock;
sampling the analog signal during a second phase of the clock, wherein the second phase of the clock begins after providing the digital output representative of the analog signal sampled during the first phase of the clock; and
after ending the second phase of the clock, providing, from the comparator, a digital output representative of the analog signal sampled during the second phase of the clock.

14. The method of claim 13, further comprising resetting the comparator after providing the digital output representative of the analog signal sampled during the second phase of the clock.

15. A method of operating a circuit to perform an analog to digital conversion, comprising:
generating pulses representative of times between the first and second phases of a clock;
providing the pulses to a comparator;
sampling an analog signal during the first phase of the clock;
after ending the first phase of the clock, providing, from the comparator, a digital output representative of the analog signal sampled during the first phase of the clock;
sampling the analog signal during the second phase of the clock, wherein the second phase of the clock begins after providing the digital output representative of the analog signal sampled during the first phase of the clock; and
after ending the second phase of the clock, providing, from the comparator, a digital output representative of the analog signal sampled during the second phase of the clock.

16. The method of claim 15, wherein rising edges of the pulses time latching of the comparator and falling edges time the resetting of the comparator.

17. The method of claim 15 wherein the step of providing the digital output representative of the analog signal sampled during the first phase of the clock further comprises comparing the analog signal to a positive reference and a minus reference.

18. A method of operating a circuit to perform an analog to digital conversion, comprising:
providing a first analog signal to a comparator sampled during a first phase of a clock;

providing a digital output from the comparator representative of the first analog signal prior to a second phase of the clock;
resetting the comparator after providing the digital output from the comparator representative of the first analog signal;
providing a second analog signal to the comparator sampled during the second phase of the clock;
providing a digital output from the comparator representative of the second analog signal after the resetting the comparator.

19. The method of claim 18, wherein the digital output from the comparator representative of the second analog signal is provided at a time between second and first phases of the clock.

20. The method of claim 19, further comprising resetting the comparator after providing the digital output from the comparator representative of the second analog signal.

* * * * *